United States Patent [19]
Lalezari et al.

[11] Patent Number: 5,770,270
[45] Date of Patent: Jun. 23, 1998

[54] PROTECTIVE AND/OR REFLECTIVITY ENHANCEMENT OF NOBLE METAL

[75] Inventors: Ramin Lalezari, Boulder; Dale E. Long, Lafayette, both of Colo.

[73] Assignee: Research Electro-Optics, Inc., Boulder, Colo.

[21] Appl. No.: 832,234

[22] Filed: Apr. 3, 1997

[51] Int. Cl.$^6$ ...................................................... B05D 1/36
[52] U.S. Cl. .................... 427/404; 427/419.2; 427/419.7
[58] Field of Search ................................ 427/404, 419.2, 427/419.7

[56] References Cited

U.S. PATENT DOCUMENTS

| | | | |
|---|---|---|---|
| 4,812,050 | 3/1989 | Epstein et al. | 374/1 |
| 4,948,685 | 8/1990 | Ohsawa et al. | 429/213 |
| 5,405,656 | 4/1995 | Nanis | 427/131 |

OTHER PUBLICATIONS

Applied Materials, Inc. news release, "Additional RIP Centura Systems Purchased by Texas Instruments," Santa Clara, California, Jan. 11, 1996.
Rapid Communications "Aluminum Mirrors A1203–protected, with high reflectance at normal but greatly decreased reflectance at higher angles of incidence in the 8–12 um region", Applied Optics, Feb. 1, 1989, pp. 333–334.
"Reflectance and durability of Ag mirrors coated with thin layers of A1203 plus reactively deposited silicon oxide", Applied Optics, Nov., 1975 pp. 2639–2644.
"Deterioration of Reflecting Coatings by Intermetallic Diffusion", Applied Optics, Jul. 1972, pp. 1594–1597.

*Primary Examiner*—Benjamin Utech
*Attorney, Agent, or Firm*—Robert E. Harris

[57] ABSTRACT

Method and structure are disclosed for forming a protective and/or reflectivity enhanced over coating layer, or layers, on a noble metal. A metallic binder layer, capable of forming a metallic bond with the noble metal and exhibiting good adhesion to the over coating layer, is deposited on the noble metal, utilizing physical vapor deposition, and the over coating layer is thereafter deposited on the metallic binder layer, again utilizing physical vapor deposition. The noble metal is preferably gold, but may be silver or an alloy of gold or silver, and may be deposited on a substrate. Each metallic binder layer is a thin layer, such as a layer of chromium, titanium, tantalum, nickel, cobalt, or an alloy thereof, and over coating is formed as a single dielectric layer of material or as a stack of alternating low and high indices of refraction dielectric layers.

18 Claims, 1 Drawing Sheet

PROTECTIVE AND/OR REFLECTIVITY ENHANCEMENT OF NOBLE METAL

FIELD OF THE INVENTION

This invention relates to protective and/or reflectivity enhancement of noble metal, and, more particularly, relates to method and structure for forming a protective and/or reflectivity enhanced over coating layer on a noble metal using a metallic binder layer therebetween.

BACKGROUND OF THE INVENTION

Noble metals have heretofore been suggested for use and/or have been utilized in connection with diverse types of devices, including, for example, use of a layer of noble metal in connection with devices providing high reflectivity.

While use of a layer of a noble metal has proved to be superior, at least in some respects, to use of a layer of other metals in connection with many diverse types of devices, including devices as above mentioned, such use of noble metals has not, however, proved to be completely satisfactory, particularly in resisting damage to the noble metals, such as, for example, not adequately resisting damage arising from exposure of the noble metals to environmental conditions and/or abrasion.

Over coating layers have also heretofore been suggested for use and/or have been utilized in connection with metals in an attempt to provide protection for and/or to enhance reflectivity of the metals, including, for example, providing an oxide over coating for aluminum reflectors (see "Aluminum mirrors $Al_2O_3$-protected, with high reflectance at normal but greatly decreased reflectance at higher angles of incidence in the 8–12 um region", by Cox and Hass, Applied Optics, Vol. 17, No. 3, pages 333–334, February 1978).

Over coating has, however, often proved to be inadequate to solve the problem when used with noble metals, due, at least in part, to the over coating failing to satisfactorily bond, or otherwise adhere, to the noble metal. In particular, it has been found that a layer, or layers, of dielectric material often do not adhere well to noble metals and, when so used, degrade and/or delaminate over time resulting in degradation of reflectivity and/or of the over coating layer, or layers.

Bonding layers have heretofore been suggested for use in conjunction with a noble metal reflector (see "Reflectance and durability of Ag mirrors coated with thin layers of $Al_2O_3$ plus reactively deposited silicon oxide", Hass et al., Applied Optics, Vol. 14, No. 11, pages 2639–2644, November 1975), and it has heretofore been observed that an over coating layer can form an intermetallic alloy when used in conjunction with a metal such as a noble metal (see "Deterioration of Reflecting Coatings by Intermetallic Diffusion", Hunter et al., Applied Optics, Vol. 11, No. 7, pages 1594–1597, July 1972).

It is felt, however, that improved devices and/or methods are still needed for protecting and/or enhancing reflectivity of noble metal.

SUMMARY OF THE INVENTION

This invention provides improved protective and/or reflectivity enhancement of noble metal, and, more particularly, provides improved method and structure for forming a protective and/or reflectivity enhanced over coating layer, or layers, on a noble metal utilizing a thin metallic binder layer between the noble metal and the over coating layer.

A thin metallic binder layer capable of forming a good metallic bond with the noble metal and exhibiting good adhesion to an over coating layer, preferably one or more layers of dielectric material such as an oxide dielectric material, is deposited, preferably by physical vapor deposition carried out in a vacuum, on the noble metal with the over coating layer, or layers, being thereafter deposited, again preferably by physical vapor deposition, on the metallic binder layer.

The noble metal may be deposited on a suitable substrate, such as metal or glass, and the noble metal is preferably gold, with silver or an alloy of gold or silver being also useable at least for some applications.

The metallic binder layer is preferably a thin layer of metallic material having a thickness such that the metallic binder layer is transparent, and may have, for example, a thickness of between five and twenty-five angstroms. In addition, the metallic binder layer must have an affinity for the noble metal, and may be formed, for example, from chromium, titanium, tantalum, nickel, cobalt, or an alloy thereof.

The over coating is preferably dielectric material and may be a single layer of dielectric material or plural layers of dielectric material, preferably in a stack made up of alternating layers of dielectric materials having low and high indices of refraction.

It is therefore an object of this invention to provide improved protective and/or reflectivity enhancement of noble metal.

It is another object of this invention to provide improved method and structure for forming a protective and/or reflectivity enhanced over coating layer, or layers, on a noble metal.

It is another object of this invention to provide an improved method and structure for forming an over coating layer, or layers, on a noble metal utilizing a binder layer between the noble metal and the over coating layer, or layers.

It is still another object of this invention to provide an improved method and structure for forming a protective and/or reflectivity enhanced over coating layer or layers, on a noble metal utilizing a thin metallic binder layer between the noble metal and over coating layer, or layers.

It is still another object of this invention to provide an improved method and structure for forming an over coating layer, or layers, on a noble metal that includes depositing a metallic binder layer on the noble metal so that the metallic binder layer bonds to the noble metal. and thereafter depositing the over coating layer, or layers, on the metallic binder layer.

It is still another object of this invention to provide an improved method and structure for forming an over coating layer, or layers, on a noble metal that includes depositing a metallic binder layer on the noble metal, and thereafter depositing the over coating layer, or layers, of dielectric material on the metallic binder layer.

It is still another object of this invention to provide an improved method and structure for forming an over coating layer, or layers, on a noble metal that includes depositing, by physical vapor deposition carried out in a vacuum, a metallic binder layer on the noble metal layer, and thereafter depositing, again by physical vapor deposition, the over coating layer, or layers, on the metallic binder layer.

With these and other objects in view, which will become apparent to one skilled in the art as the description proceeds, this invention resides in the novel method and structure substantially as hereinafter described and more particularly defined by the appended claims, it being understood that changes in the precise embodiment of the herein disclosed invention are meant to be included as come within the scope of the claims.

BRIEF DESCRIPTION OF THE DRAWING

The accompanying drawings illustrate complete embodiments of the invention according to the best mode so far devised for the practical application of the principles thereof, and in which.

DESCRIPTION OF THE INVENTION

Figure 1:
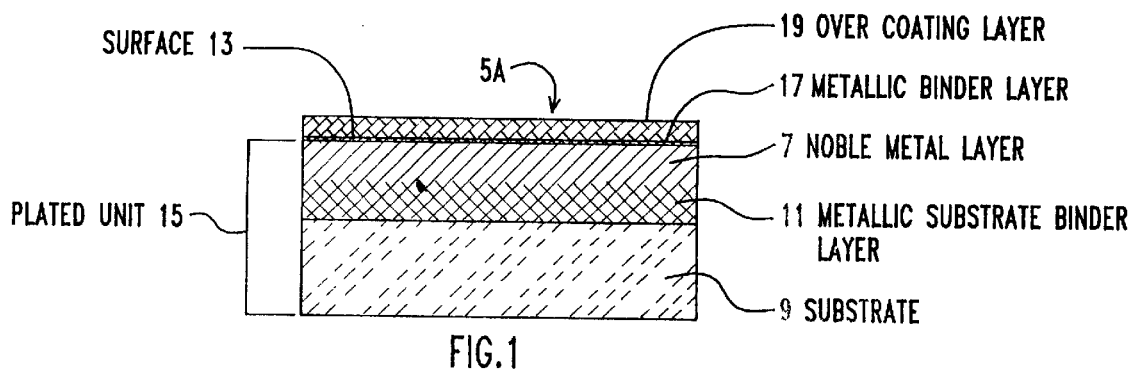
FIG. 1 illustrates a partial cross-section of a structure formed in accordance with this invention.
Figure 2:
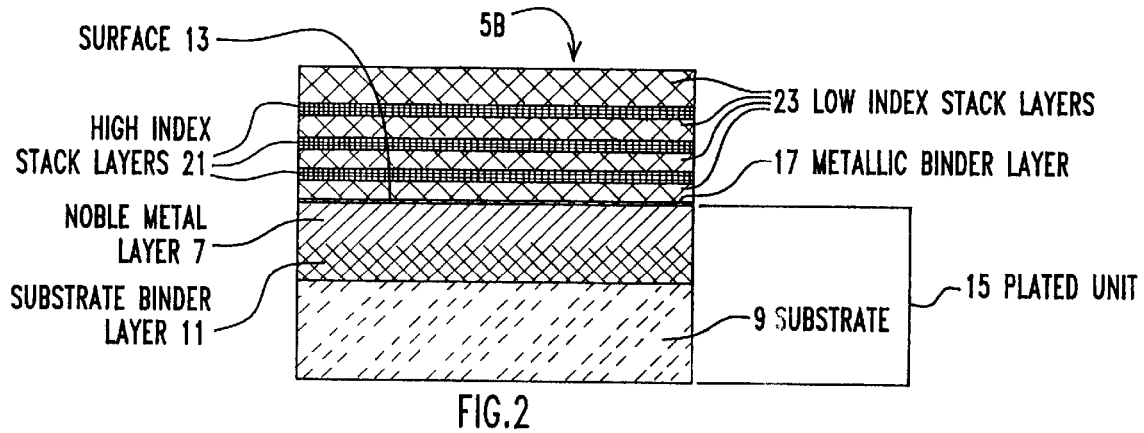
FIG. 2 illustrates a partial cross-section of an alternate structure formed in accordance with this invention.

As shown in FIGS. 1 and 2, structures 5A and 5B include a layer (as used throughout this specification, including the claims, the term "layer" is meant to include comparable terms, such as the terms "coat" and "film") of noble metal 7, deposited on substrate 9, preferably, but not necessarily, with a metallic substrate binder layer 11 therebetween, so that the noble metal 7 presents an outer surface 13.

Noble metal 7 is preferably gold, but, for at least some applications, may also be silver or an alloy of gold or silver. Substrate 9 may be an aluminum layer, and metallic substrate binder layer 11, if utilized, is a metal having an affinity for both the noble metal and the substrate, and may be, for example, nickel that is plated to the Substrate and has the noble metal plated thereon to form plated unit 15.

Metallic binder layer 17 is deposited on surface 13 of noble metal 7, and over coating (comprising a single over coating layer 19 of dielectric material, as indicated in FIG. 1, or plural over coating layers 21 and 23 of dielectric material having different indices of refraction, as indicated in FIG. 2) is deposited on metallic binder layer 17.

Metallic binder layer 17 is chosen to provide good bonding of the binder layer with the noble metal and good adhesion of the binder layer to the over coating layer, or layers, while still being sufficiently thin so as to be greatly, or substantially, transparent to optical radiation, and is preferably a pure (i.e., non-oxidized) metal having an affinity for the noble metal so that the binder layer forms a metallic bond to noble metal 7, and also has an affinity for the dielectric material to ensure good adhesion.

Metallic binder layer 17 is preferably a thin metallic layer having a thickness such that the metallic layer is substantially transparent, and may be a thin metallic layer having a thickness of between about five angstroms and twenty-five angstroms (it is meant to be realized, however, that a thickness below five angstroms and/or a thickness above twenty-five angstroms could also be utilized, at least for some applications, so long as the metallic binder layer is substantially transparent). The metallic binder layer is now preferably formed from chromium, titanium, tantalum, or an alloy thereof, but might also be formed from nickel, cobalt, or an alloy thereof.

The use of thin metal as the metallic binder layer allows reflectivity of the underlying noble metal to be maintained while allowing reliable adhesion of the over coating layer, or layers, to thus provide environmental protection and/or reflectivity enhancement (and/or to maximize reflectivity) at least over specific ranges, or regions, of wavelengths (the near infrared region of the spectrum, for example, which is approximately 50 nm wide) without causing severe degradation of the broad band reflectivity of the surface.

Over coating layer 19, as shown in FIG. 1, is formed from a dielectric material, such as an oxide material (silicon dioxide, for example) and, if multiple layers of over coating are utilized, as indicated in FIG. 2, such layers may, for example, be a dielectric stack of layers 21 and 23 having alternating low and high indices of refraction, such as formed by alternating layers of different oxide dielectric materials having different indices of refraction, such as, for example, silicon dioxide ($SiO_2$) which has a low index of refraction and titanium dioxide ($TiO_2$) which has a high index of refraction.

It is meant to be realized, however, that the single or multiple layers of dielectric material could also be formed from other dielectric materials having a low index of refraction, such as, for example, aluminum oxide ($Al_2O_3$) or magnesium fluoride ($MgF_2$), or other dielectric materials having a high index of refraction, such as, for example, tantalum pentoxide ($Ta_2O_5$) or zinc sulfide (ZnS).

Over coating layer 19, as indicated in FIG. 1, is preferably a thick layer relative to metallic binder layer 17 and typically has an optical thickness of approximately one-quarter wavelength of the wavelength of interest, while each of the over coating layers 21 and 23 likewise typically has an optical thickness of approximately one-quarter wavelength of the wavelength of interest except for the outermost layer of layers 23 which has approximately twice the thickness of the other layers of layers 23, as is indicated in FIG. 2.

By way of example, if the wavelength of interest is 950 nm, then the physical thickness of the high index of refraction layers 21 would be 1130 angstroms (where titanium dioxide is the material utilized), while the physical thickness of the low index of refraction layers 23 would be 1626 angstroms (where silicon dioxide is the material utilized), except for the outermost layer which would have a thickness of 3252 angstroms (where silicon dioxide is the material utilized).

Noble metal 7 may be conventionally deposited as a layer on substrate 9 using a plating process (or, alternately, by physical vapor deposition), optionally using metallic substrate binder layer 11 between substrate 9 and noble metal 7 to form unit 15. The structure of this invention is then formed, or further formed, by depositing metallic binder layer 17 on surface 13 of noble metal layer 7 to bond the metallic binder layer 15 to the noble metal layer 7, with over coating layer 19 (or alternating over coating layers 21 and 23) being thereafter deposited on metallic binder layer 17 to adhere the over coating layer, or layers, to the metallic binder layer.

Depositing of metallic binder layer 17 on noble metal layer 7 is achieved using physical vapor deposition carried out in a vacuum, and is preferably deposition using electron gun evaporation carried out in a substantially oxygen-free environment to ensure that the resulting bonded layer is a pure metal or alloy of such metals. Alternately, the binder layer could, at least for some applications, be deposited using other vacuum techniques, such as sputtering, chemical vapor deposition or molecular beam deposition.

Over coating layer 19 is deposited on metallic binder layer 17, using physical vapor deposition carried out using a backfill of oxygen, and is also preferably deposition using electron gun evaporation. The over coating layer, or layers, could also be deposited using the techniques as outlined above for depositing metallic binder layer 17.

By way of specific illustration, gold plated units 15, comprising an aluminum substrate that has been nickel plated and then gold plated to provide a surface 13 with high reflectivity in the infrared region of the spectrum, were over coated with either a thin dielectric layer of oxide material or, alternately, with a plurality of alternating thin dielectric layers of different oxide materials, using a thin binder layer between the gold layer and the dielectric layer, or layers.

Figure 3:
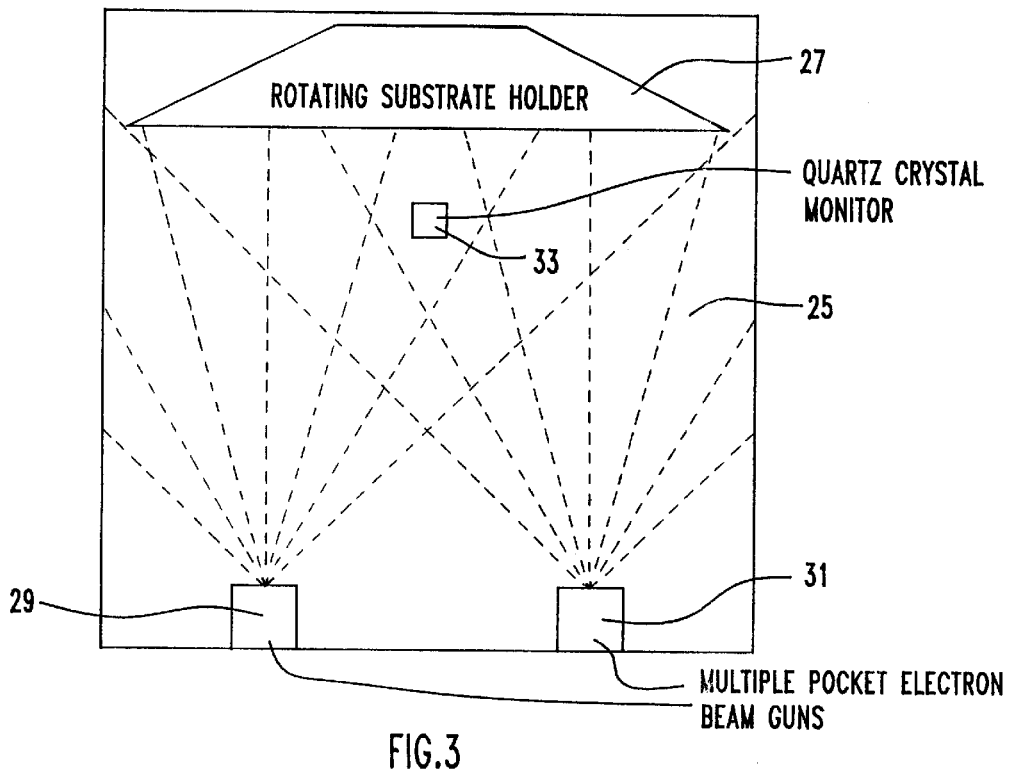
FIG. 3 is a simplified sketch illustrating a device for depositing a layer, or layers, of material by physical vapor deposition.

The layers were produced in a cryogenically pumped optical box coater with a chamber 25, as indicated in FIG. 3, having therein a glow discharge plasma treatment cleaning system, a rotating substrate holder 27 for mounting of units to be cleaned thereon, a pair of electron guns 29 and 31 capable of depositing layers of several different materials in one operation on units to be cleaned when mounted on rotating substrate holder 27, and a quartz crystal monitor 33 to control layer thickness and deposition rates.

After aqueous cleaning of unit 15, the unit was positioned on rotating substrate holder 27 in chamber 25. After evacuating chamber 25, the glow discharge cleaning system was used for fifteen minutes to remove contaminants from the surface of the reflector unit. After glow discharge cleaning, the chamber was evacuated to the $10^{-5}$ millibars pressure range. A chromium layer (i.e., a binder layer) was then evaporated at a rate of 0.25 angstroms per second using an electron gun under rate control. The chromium deposition was stopped after a thickness of 12.5 angstroms was reached.

Over coating of one group of units with a single over coating layer and over coating of a different group of units with plural over coating layers was carried out with the single layer being deposited using an electron beam gun to deposit an oxide dielectric layer of silicon dioxide ($SiO_2$) using a backfill of oxygen in the chamber with a pressure of $1.5 \times 10^4$ millibars with deposit under rate control of 4.5 angstroms per second, and with the plural over coating layers being deposited using a pair of electron guns to deposit four alternating layers of silicon dioxide ($SiO_2$) and titanium dioxide ($TiO_2$) and an outer thicker layer of silicon dioxide using a backfill of oxygen in the chamber with a pressure of $1.5 \times 10^{-4}$ millibars and $2.5 \times 10^{-4}$ millibars for the silicon dioxide and titanium dioxide, respectively, and with the two oxide materials being deposited under rate control with rates of 4.5 and 1.1 angstroms per second for the silicon dioxide and titanium dioxide, respectively.

After each deposition of the oxide layer, or layers where utilized, the chamber was vented and the completed structure was removed from the chamber (the completed structure for each unit of the group of units having a single over coating layer being as indicated in FIG. 1, and the completed structure for each unit having plural over coating layers being as indicated in FIG. 2).

Units having an over coating layer, or layers, thereon with a binder layer between the over coating layer, or layers, and the noble layer, as set forth in this invention, have been found to exhibit enhanced reflectivity for the region of wavelength for which the layers have an optical thickness (physical thickness multiplied by the index of refraction) of approximately 0.25 wavelengths. The units have also been found to have a sufficiently hard surface to resist abrasion (exceeding the abrasion requirements of Sections 3.7–3.9 of MIL-M-13508C), and have exhibited no degradation of adhesion of the over coating layer, or layers, after exposure to multiple temperature cycles between room temperature and 175 degrees centigrade and exposure to prolonged periods of high humidity (95%) and elevated temperatures (80 degrees centigrade).

As can be appreciated from the foregoing, this invention provides improved process and structure for forming a protective and/or reflectivity enhanced layer on a noble metal utilizing a metallic binder layer between the noble layer and the over coating layer, or layers.

What is claimed is:

1. A method for forming over coating on a noble metal, said method comprising:

providing a noble metal having a surface;

depositing a thin metallic binder layer on said surface of said noble metal with said metallic binder layer having a thickness such that said metallic binder layer is substantially transparent; and depositing at least one coating layer on said thin metallic binder layer.

2. The method of claim 1 wherein said step of depositing a thin metallic binder layer on said surface of said noble metal includes forming a metallic bond between said metallic binder layer and said noble.

3. The method of claim 1 wherein said method includes providing a substrate having a noble metal thereon as said step of providing a noble metal.

4. The method of claim 1 wherein said step of providing a noble metal includes providing one of gold, sliver, and alloys thereof as said noble metal.

5. The method of claim 1 wherein said step of depositing a thin metallic binder layer on said surface of said noble metal includes providing a metallic binder layer having a thickness of between about five angstroms and twenty-five angstroms.

6. The method of claim 1 wherein said step of depositing a thin metallic binder layer on said surface of said noble metal includes choosing a metal selected from the group consisting of chromium, titanium, tantalum, nickel, cobalt, and alloys thereof for use as said thin metallic binder layer.

7. The method of claim 1 wherein said step of depositing at least one over coating layer on said thin metallic binder layer includes depositing at least one dielectric layer as said at least one over coating layer on said metallic binder layer.

8. The method of claim 7 wherein said step of depositing at least one dielectric layer on said thin metallic binder layer includes depositing a single dielectric layer on said thin metallic binder layer.

9. The method of claim 1 wherein said steps of depositing a thin metallic binder layer on said noble metal and depositing at least one over coating layer on said thin metallic binder layer are carried out by physical vapor deposition.

10. The method of claim 1 wherein said method includes depositing said thin metallic binder layer on said surface of said noble metal and depositing said at least one over coating layer on said thin metallic binder layer to provide at least one of protection and reflectivity enhancement of the noble metal.

11. A method for forming over coating on a noble metal, said method comprising:

Providing a noble metal having a surface;

depositing a thin metallic binder layer or said surface of said noble metal; and alternately depositing low and high indices of refraction dielectric over coating layers on said thin metallic binder layer.

12. The method of claim 11 wherein said step of alternately depositing low and high indices of refraction dielectric layers on said thin metallic binder layer includes choosing a dielectric material having a low index of refraction from the group consisting of silicon dioxide, aluminum oxide, and magnesium fluoride, and choosing a dielectric material having a high index of refraction from the group consisting of titanium dioxide, tantalum pentoxide, and zinc sulfide.

13. A method for forming over coating on gold, said method comprising:
    providing a layer of gold by providing an aluminum substrate and plating said layer of gold onto said substrate;
    bonding a thin metallic binder layer to said layer of gold; and
    depositing at least one dielectric layer as an over coating layer on said thin metallic binder layer.

14. A method for forming over coating on gold, said method comprising:
    providing a layer of gold;
    bonding a thin metallic binder layer to said layer of gold with said thin metallic binder layer being a deposited layer having a thickness such that said metallic binder layer is substantially transparent; and
    depositing at least one dielectric layer as an over coating layer on said thin metallic binder layer.

15. The method of claim 14 wherein said step of bonding a thin metallic binder layer to said layer of gold includes providing said thin metallic binder layer from the group consisting of chromium, titanium, tantalum, nickel, cobalt, and alloys thereof.

16. The method of claim 14 wherein said step of depositing at least one dielectric layer on said thin metallic binder layer includes depositing a single layer of dielectric material on said thin metallic binder layer.

17. A method for forming over coating on gold, said method comprising:
    providing a layer of gold;
    bonding a thin metallic binder layer to said layer of gold; and
    alternately depositing low and high indices of refraction dielectric layers as over coating layers on said thin metallic binder layer.

18. The method of claim 17 wherein said steps of depositing a thin metallic binder layer on said layer of gold and depositing at least one dielectric layer on said thin metallic binder layer are by physical vapor deposition.

* * * * *